United States Patent
Wang et al.

(10) Patent No.: US 9,188,909 B2
(45) Date of Patent: Nov. 17, 2015

(54) METHOD FOR MONITORING DEVELOPER SOLUTION AND A DEVELOPING APPARATUS

(71) Applicant: BOE Technology Group Co., Ltd., Beijing (CN)

(72) Inventors: Can Wang, Beijing (CN); Weijie Wang, Beijing (CN); Xuan He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 257 days.

(21) Appl. No.: 13/973,057

(22) Filed: Aug. 22, 2013

(65) Prior Publication Data

US 2014/0055760 A1    Feb. 27, 2014

(30) Foreign Application Priority Data

Aug. 24, 2012    (CN) .......................... 2012 1 0307188

(51) Int. Cl.
 *G03G 15/10*    (2006.01)
 *G03F 7/32*    (2006.01)

(52) U.S. Cl.
 CPC ............... *G03G 15/105* (2013.01); *G03F 7/32* (2013.01)

(58) Field of Classification Search
 CPC ............... G03F 7/32; G03F 7/26; G03F 7/30; G03F 7/3028; G03F 7/3071; G03F 7/70483; G03F 7/7085; G03F 7/70525; G03F 7/70608; G03F 7/70616; G03F 7/70725; G03F 15/105; B29C 35/0888
 See application file for complete search history.

(56) References Cited

U.S. PATENT DOCUMENTS

| | | | |
|---|---|---|---|
| 5,897,240 A | 4/1999 | Yoo | |
| 6,091,914 A | 7/2000 | Yoo | |
| 7,833,389 B1 * | 11/2010 | Slafer | .......................... 204/237 |
| 2004/0096760 A1 | 5/2004 | Tateyama et al. | |
| 2007/0010036 A1 | 1/2007 | Endo et al. | |

FOREIGN PATENT DOCUMENTS

| | | |
|---|---|---|
| CN | 1228547 A | 9/1999 |
| CN | 1501177 A | 6/2004 |
| JP | 9-126865 A | 5/1997 |

OTHER PUBLICATIONS

First Office Action (Chinese Language) for Chinese Patent Application No. 201210307188.5, 5 pages.
Second Office Action (Chinese Language) for Chinese Patent Application No. 201210307188.5, 4 pages.

(Continued)

*Primary Examiner* — Peter B Kim
*Assistant Examiner* — Michelle Iacoletti
(74) *Attorney, Agent, or Firm* — Ladas & Parry LLP

(57) ABSTRACT

A developing apparatus comprises: a photodetection unit, which emits detecting light toward the development area of the substrate to be developed within a scheduled time after the substrate to be developed is immersed into the developer solution; and a processing unit electrically coupled with the photodetection unit for determining the time interval which it takes for development to occur in the development area by means of the detecting light, and for determining that the developer solution is failed if the development time interval is determined to be out of the preset time range. A method for monitoring the developer solution is also provided.

12 Claims, 3 Drawing Sheets

(56) References Cited

OTHER PUBLICATIONS

English translation of First Office Action (listed above) from Chinese Patent Office in Chinese Patent Application No. 201210307188.5, 2 pages.

English translation of Second Office Action (listed above) from Chinese Patent Office in Chinese Patent Application No. 201210307188.5., 4 pages.

English translation of Japanese Patent Application JPH09126865 A, 7 pages.

English translation of Chinese Patent Application CN1228547 A, 11 pages.

English translation of Chinese Patent Application CN1501177 A, 31 pages.

* cited by examiner

METHOD FOR MONITORING DEVELOPER SOLUTION AND A DEVELOPING APPARATUS

CROSS REFERENCE TO RELATED APPLICATIONS

This application claims priority from Chinese National Application No. 201210307188.5 filed on Aug. 24, 2012, the contents of which are incorporated herein by reference.

TECHNICAL FIELD

The present invention relates to the technical field of liquid crystal display, in particular to a method for monitoring developer solution and a developing apparatus.

BACKGROUND

In the process for manufacturing a Thin Film Transistor-Liquid Crystal Display (TFT-LCD), it's usually required to create a circuit pattern on an array substrate by using patterning technology. Developing is one significant process in the patterning technology, and the exposed pattern can only be presented with the action of the developer solution. The developer solution, through some chemical reactions, can etch away a portion of the photoresist on a transparent substrate which is not needed for the pattern formed by exposure with a mask plate. To guarantee the developing effect, the quality of the developer solution plays a very important role, however, in majority of the existing developing systems, the developer solution is used in a recycling way, and thus as the using times of the developer solution increases, the developer solution would be gradually contaminated and thus the developing effect degrade obviously. In order to ensure quality of developer solution, some of the manufacturers directly discharge the developer solution after it is used only once or a few times, which, although improves the product yield, reduces recycling times, increases the amount of the used developer solution, and thus increases cost of products. In order to ensure product yield while improving usage of the developer solution, it's possible to make real-time monitoring of developing effect of the developer solution during the course of recycling the developer solution, and make a dynamical regulation of the concentration of the developer solution to reach a better developing effect. In prior art, monitoring the quality of the developer solution may be mainly realized by measuring a concentration of the developer solution and a concentration of a certain component of the photoresist. However, as different developer solutions have component mixing ratios different from each other, and existing systems for monitoring developer solution perform monitoring on multiple components in the developer solution, it's difficult to report developing effect of the developer solution intuitively and accurately. When a system for monitoring developer solution can not intuitively and effectively evaluate developing effect of developer solution, it's inevitable to waste developer solution or cause poor developing effect of the developer solution.

SUMMARY

The embodiment of present invention provides a method for monitoring developer solution and a developing apparatus, which are capable of effectively and accurately monitoring the developing effect of the developer solution.

According to embodiments of the present invention, a developing apparatus is provided, which comprises: a dipper for accommodating developer solution and a substrate supporter located in the dipper for placing the substrates to be developed thereon and allowing light to pass through. The substrate to be developed is coated thereon with photoresist of a first color. The developing apparatus further comprises: a photodetection unit, the photodetection unit emitting detecting light toward a development area of the substrate to be developed within a scheduled time after the substrate to be developed is immersed into the developer solution; and a processing unit electrically coupled with the photodetection unit, for determining a development time interval which it takes for development to occur in the development area by means of the detecting light, and determining that the developer solution is failed, if the development time interval is determined to be out of a preset time range.

In some embodiments, the photodetection unit comprises: a light-emitting module provided at a side of the substrate supporter, the light-emitting module emitting the detecting light of a second color toward the development area of the substrate to be developed within the scheduled time after the substrate to be developed is immersed into the developer solution; and a light-receiving module provided at the other side of the substrate supporter opposite to the light-emitting module, for receiving the detecting light from the light-emitting module.

The processing unit can determine the development time interval by obtaining a first time point when the light-emitting module emits the detecting light and a second time point when the light-receiving module receives the detecting light, and by calculating a time interval between the first time point and the second time point.

Preferably, the developing apparatus further comprises: a color sensing unit provided at a side of the substrate supporter, and the color sensing unit is used to emit chrominance detecting light toward the development area of the substrate to be developed after the second time point and determining a chromatic value of the development area by means of the chrominance detecting light. The processing unit is electrically coupled with the color sensing unit, and is also used determine that the developer solution is failed if the chromatic value is determined to be out of the preset chrominance range.

In some embodiments, the photodetection unit can comprise: a color sensing module provided at a side of the substrate supporter, the color sensing module emitting chrominance detecting light toward the development area of the substrate to be developed within a scheduled time after the substrate to be developed is immersed into the developer solution, receives reflected light from the development area, and determines the chromatic value of the development area by means of the reflected light.

The processing unit can determine the development time interval by obtaining a first time point when the color sensing module emits the light and a second time point when the chromatic value of the development area varies to be within a preset chrominance range, and by calculating a time interval between the first time point and the second time point.

Preferably, the processing unit is also used to: determine that a concentration value of the developer solution is less than a preset concentration value if the determined development time interval is greater than a first preset time; and determine that the concentration value of the developer solution is greater than the preset concentration value if the determined development time interval is less than a second preset time, wherein the first preset time is greater than the second preset time.

Preferably, the developing apparatus further comprises: an indicating unit electrically coupled with the processing unit, for indicating failure of the developer solution to a user when the developer solution is determined to be failed by the processing unit.

According to embodiments of the present invention, a method for monitoring developer solution is provided, which is used in a developing process of a substrate to be developed in the developer solution, wherein the substrate to be developed is coated thereon with photoresist of a first color. The method comprising: emitting detecting light toward a development area of the substrate to be developed within a scheduled time after the substrate to be developed is immersed into the developer solution; determining a development time interval which it takes for development to occur in the development area by means of the detecting light; and determining that the developer solution is failed if the development time interval is determined to be out of a preset time range.

In some embodiments, said emitting detecting light toward the development area of the substrate to be developed within a scheduled time after the substrate to be developed is immersed into the developer solution comprises: emitting the detecting light of a second color toward the development area of the substrate to be developed within a scheduled time after the substrate to be developed is immersed into the developer solution; and receiving the detecting light of the second color. Furthermore, said determining the development time interval which it takes for development to occur in the development area by means of the detecting light comprises: obtaining a first time point when the detecting light is emitted and a second time point when the detecting light is received, and calculating a time interval between the first time point and the second time point as the development time interval.

Preferably, the method further comprises: emitting chrominance detecting light toward the development area of the substrate to be developed after the second time point; determining a chromatic value of the development area by means of the chrominance detecting light; and determining that the developer solution is failed if the chromatic value is determined to be out of a preset chrominance range.

In some embodiments, said emitting detecting light toward the development area of the substrate to be developed within a scheduled time after the substrate to be developed is immersed into the developer solution comprises: emitting chrominance detecting light toward the development area of the substrate to be developed within a scheduled time after the substrate to be developed is immersed into the developer solution; and determining a chromatic value of the development area by means of the chrominance detecting light. Furthermore, said determining the development time interval which it takes for development to occur in the development area by means of the detecting light comprises: obtaining a first time point when the detecting light is emitted and a second time point when the chromatic value of the development area varies be to within a preset chrominance range, and calculating a time interval between the first time point and the second time point as the development time interval.

Preferably, the method further comprises: determining that a concentration value of the developer solution is less than a preset concentration value if the determined time interval is greater than a first preset time; and determining that the concentration value of the developer solution is greater than the preset concentration value if the determined time interval is less than a second preset time, wherein the first preset time is greater than the second preset time.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
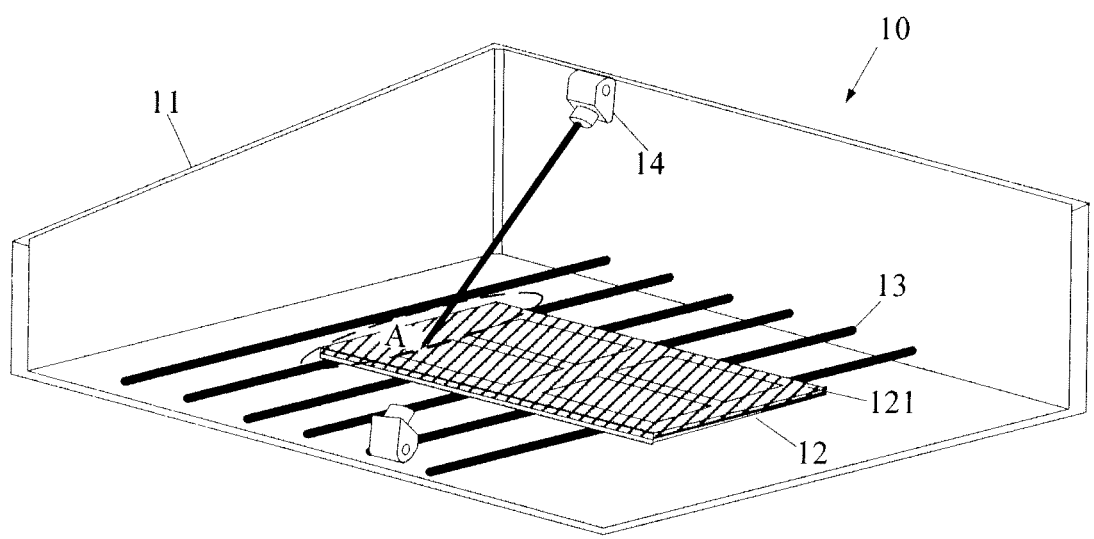
FIG. 1 is a structural schematic view of the developing apparatus according to the first embodiment of present invention.

As shown in FIG. 1, a developing apparatus 10 provided according to the first embodiment of the present invention comprises a dipper 11 for accommodating developer solution and a substrate supporter 13 located in the dipper 11 for placing a substrate to be developed thereon and allowing light to pass through. The substrate 12 to be developed is coated with photoresist 121 of a first color.

As shown in FIG. 1, the developing apparatus 10 further comprises a photodetection unit 14, which emits detecting light toward a development area of the substrate 12 to be developed (area A in FIG. 1) within a scheduled time after the substrate 12 to be developed is immersed into the developer solution.

The photodetection unit 14 is electrically connected to a processing unit (not shown). The processing unit is used to determine the time interval which it takes for development to occur in the development area by means of the detecting light, and to determine that the developer solution is failed if the time interval is determined to be out of a preset time range.

The developing apparatus provided according to the embodiment of present invention is used in developing process of a substrate to be developed immersed into the developer solution, wherein the detecting unit emits detecting light toward the development area of the substrate to be developed within a scheduled time after the substrate to be developed is immersed into the developer solution; the processing unit electrically coupled with the photodetection unit determines whether the developer solution has been failed by determining the time interval which it takes for development to occur in the development area by means of the detecting light and by comparing the time interval with a preset time range. With such a developing apparatus, by directly detecting the peeling process of the photoresist, it's possible to effectively and accurately monitor the developing effect of the developer solution during the course of recycling the developer solution, thereby avoiding the wastage of the developer solution while ensuring the developing effect of the developer solution. In so doing, not only manufacturing cost of products is reduced, but also product quality is largely improved.

Any of the existing light detecting devices can be used as the photodetection unit 14. For example, the photodetection unit 14 may be a couple formed of a light transmitter and a light receiver arranged oppositely. As shown in Figures, the photodetection unit 14 can specifically comprise:

a light-emitting module 141 provided at a side of the substrate supporter 13, the light-emitting module 141 emitting detecting light of a second color toward a development area of the substrate 12 to be developed within a scheduled time after the substrate 12 to be developed is immersed into the developer solution; and a light-receiving module 142 provided at the other side of the substrate supporter 13 opposite to the light-emitting module 141 for receiving the detecting light from the light-emitting module 141.

For example, a light generator or a laser can be used as the light-emitting module 141 to emit detecting light toward a preset detection area on the substrate; the light-receiving module 142 can use a light receiver or other light sensors to receive the detecting light. The positions of the light generator and light receiver correspond to each other exactly, located respectively at either side of the substrate 12 to be developed which is coated with photoresist. Thus, when the photoresist in the development area peels due to the developer solution, the detecting light emitted from the light generator will pass through the substrate 12 to be developed and hit onto the light receiver, and when the light receiver pickups the detecting light, its determined that the photoresist has peeled due to the developer solution.

Accordingly, the processing unit can determine the development time interval, in particular by obtaining a first time point when the light-emitting module 141 emits light and a second time point when the light-receiving module 142 receives light, and by calculating a time interval between the first time point and the second time point; and determine that the developer solution is failed if the time interval is determined to be out of the preset time range. With such a developing apparatus, by directly detecting the peeling process of the photoresist, it's possible to effectively and accurately monitor the developing effect of the developer solution during the course of recycling the developer solution, thereby avoiding the wastage of the developer solution while ensuring the developing effect of the developer solution. In so doing, not only manufacturing cost of products is reduced, but also product quality is largely improved.

Figure 2:
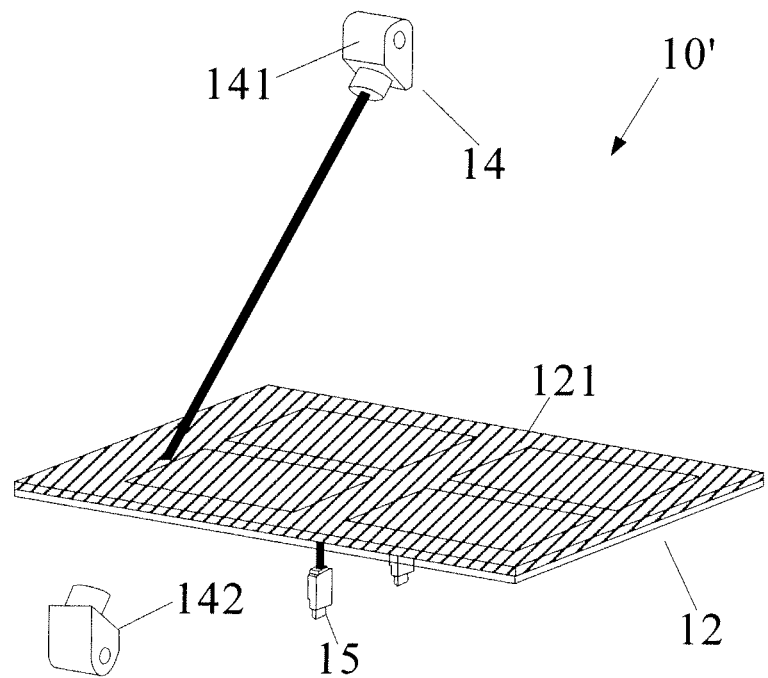
FIG. 2 is a partial structural schematic view of the developing apparatus according to the second embodiment of present invention.

FIG. 2 shows a developing apparatus 10' according to the second embodiment of the present invention. As compared with the developing apparatus 10 according to the first embodiment shown in FIG. 1, as shown in FIG. 2, the developing apparatus 10' can further comprise a color sensing unit 15 arranged at a side of the substrate supporter (not shown in FIG. 2). The color sensing unit 15 is used to emit detecting light toward the development area of the substrate to be developed 12 after the second time point, and to determine a chromatic value in the development area by means of the detecting light.

Accordingly, the processing unit can also be electrically coupled with the color sensing unit 15, and be used to determine that the developer solution is failed if the determined chromatic value is out of the preset chrominance range.

For example, the color sensing unit 15 can be at least one color sensor provided corresponding to the development area. The color sensor can emit a trichroic light source toward the substrate 12 to be developed. The photoresist on the substrate 12 to be developed would be selectively transmissive or reflective to the three colors in the trichroic light. The amount of reflected light received by the color sensor would be converted to ratios among amounts of the lights having the three colors respectively, and thus it's possible to identify the color of the substrate 12 to be developed after development. The detecting result can be converted into a digital chromatic value, which value is compared with the preset chrominance range, and then determination can be made whether the photoresist in the development area has passed through a complete development. Thus, the accuracy of the detection is further ensured.

Figure 3:
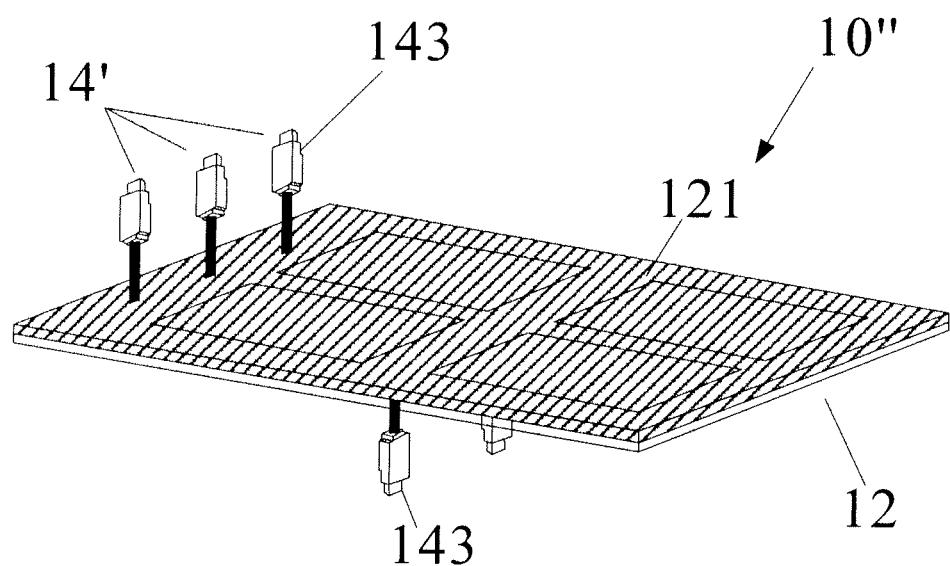
FIG. 3 is a partial structural schematic view of the developing apparatus according to the third embodiment of present invention.

FIG. 3 shows a partial structural schematic view of the developing apparatus according to the third embodiment of the present invention, wherein the developing apparatus employs a color sensor to detect the development progress of the photoresist in the development area of the substrate to be developed. As shown in FIG. 3, the photodetection unit 14' can comprise a color sensing module 143 provided at a side of the substrate supporter 13. The color sensing module 143 emits chrominance detecting light toward the development area of the substrate 12 to be developed within a scheduled time after the substrate 12 to be developed is immersed into the developer solution; receives the reflected light from the development area; and determines the chromatic value of the development area by means of the reflected light.

For example, the color sensing module 143 can use a RGB color sensor. The color sensor can emit a trichroic light toward the substrate 12. The photoresist 121 on the substrate 12 would be selectively transmissive or reflective to the three colors in the trichroic light. The amount of reflected light received by the color sensor would be converted to ratios among amounts of the lights having the three colors respectively, and thus it's possible to identify the color of the substrate 12 after development. The detecting result can be converted into a digital chromatic value.

Accordingly, the processing unit can determine the development time interval, in particular by obtaining a first time point when the color sensing module 143 emits light and a second time point when the chromatic value of the development area varied to be within the preset chrominance range, and by calculating the time interval between the first time point and the second time point; and can determine that the developer solution is failed if the time interval is determined to be out of the preset time range. With such a developing apparatus, by directly detecting the peeling process of the photoresist, it's possible to effectively and accurately monitor the developing effect of the developer solution during the course of recycling the developer solution, thereby avoiding the wastage of the developer solution while ensuring the developing effect of the developer solution. In so doing, not only manufacturing cost for products is reduced, but also product quality is largely improved.

Although not shown in the figures, the developing apparatus 10, 10', and 10" according to the above embodiments of present invention each can further comprise: an indicating unit (not shown) electrically coupled with the processing unit for indicating the failure of the developer solution to a user when the developer solution is determined to be failed by the processing unit.

And further, the processing unit can also used to: determine that the concentration value of the developer solution is less than the preset concentration value if the determined time interval is greater than a first preset time; and determine that the concentration value of the developer solution is greater than the preset concentration value if the determined time interval is less than a second preset time, wherein the first preset time is greater than the second preset time.

For example, when the first preset time is 20 s, then if the detected time interval is 25 s, it's determined that the developer solution has a weak developing capacity and poor developing effect. The degrading of the developing effect usually is due to the decreasing of the concentration of the developer solution, which may cause an incomplete development of the photoresist within the scheduled time. When the time interval is greater than the first preset time, the concentration of the developer solution can be increased to a preset concentration value with user's manual regulation or with auto regulation by the regulating device, or by replacing the developer solution.

As another example, when the second preset time is 10 s, then if the detected time interval is 5 s, it's determined that the developing capacity of the developer solution is too strong and the developing effect is excessively powerful. Usually, excessively powerful developing effect is caused by too high concentration of the developer solution, which will cause excessive development of the photoresist within the scheduled time and thus cause peeling of photoresist in an area that is not intended to be developed. When the time interval is less than the second preset time, the concentration of the developer solution can be decreased to the preset concentration value with user's manual regulation or with auto regulation by the regulating device, or by replacing the developer solution.

The preset concentration value of the developer solution can be a preferred value of the concentration of the developer solution selected manually during the developing process. When the concentration value of the developer solution is this preset concentration value, the developer solution has an optimal developing effect.

A detailed description about the operation of the developing apparatuses provided according to the embodiments of present invention will be made in the following. To be noted, a developing apparatus 10' shown in FIG. 2, in which the couple of a light-emitting module and a light-receiving module arranged oppositely are used as the photodetection unit 14, will be taken as an example, and the description thereof will be made with reference to FIGS. 2, 4 and 5.

As shown in FIG. 2, with a substrate 12 to be developed coated with green photoresist 121 as an example, as the substrate 12 to be developed enters into the dipper 11 and start to be developed, the developing apparatus 10' monitors the developing effect of the developer solution simultaneously.

As shown in FIG. 2, the positions of the light-emitting module 141 and the light-receiving module 142 correspond with each other exactly, located at either side of the substrate supporter 13 respectively. A red light emitter can be used as the light-emitting module 141, and correspondingly, a red light receiver can be used as the light-receiving module 142.

The light-emitting module begins to emit red light toward the development area on the substrate 12 at the first time point, so as to start monitoring the developing effect of the developer solution. The development area has no circuit pattern thereon, and the photoresist in this area will gradually peel as the developing process proceeds.

In the initial stage of development, the green photoresist 121 on the substrate remain unpeeled, and the red light emitted from the light-emitting unit 14 can not pass through the photoresist 121 and thus the light-receiving module 142 receives no signals.

Figure 4:
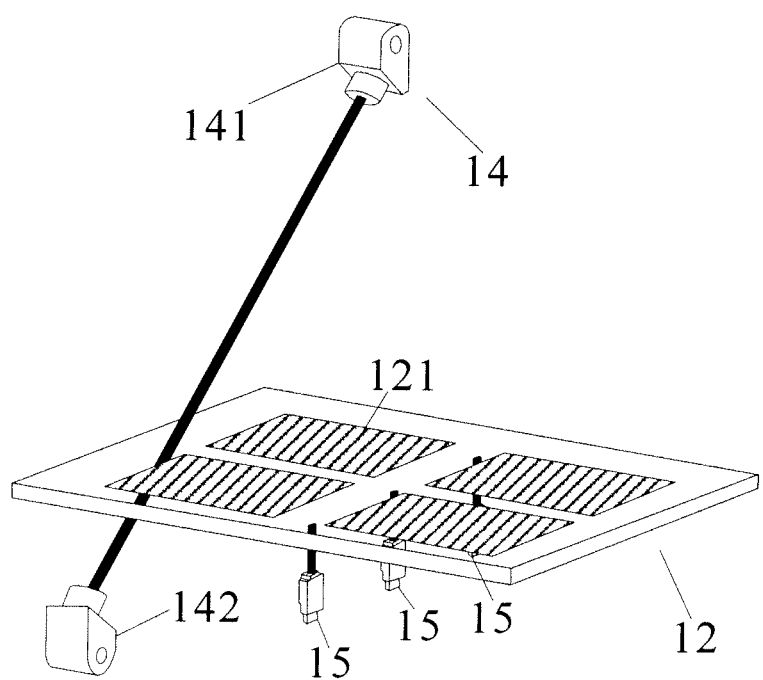
FIG. 4 is another partial structural schematic view of the developing apparatus according to the second embodiment of present invention.

As the development proceeds gradually, the green photoresist 121 in the development area will peel completely, as shown in FIG. 4. At this time, the red light emitted from the light-emitting module 141 will pass through the substrate 12 and reach the light-receiving module 142 arranged at the position corresponding to the light-emitting module 141, and this time point will be recorded as the second time point. The processing unit (not shown) can obtain the time interval between the first time point and the second time point. If this time interval is out of the preset time range, the developer solution can be determined to be failed. Specifically, if the time interval is greater than a first preset time, the processing unit can determine that the concentration value of the developer solution is less that a preset concentration value, and then the indicating unit can indicate to the user that the concentration value of the developer solution is too low; and if the time interval is less than a second preset time, the processing unit can determine that the concentration value of the developer solution is greater than the preset concentration value, and the indicating unit can indicate to user that the concentration value of the developer solution is too high. Thus, the user can regulate the concentration of the developer solution or replace it.

Figure 5:
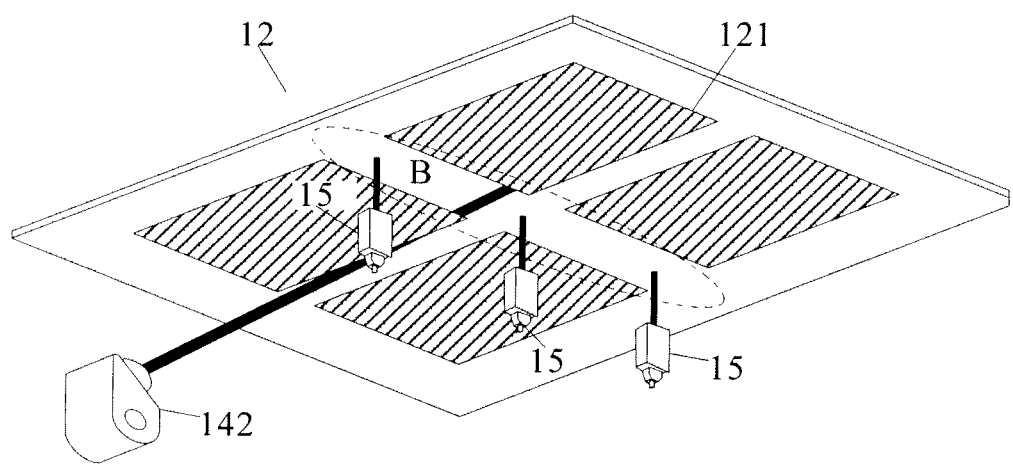
FIG. 5 is a partial bottom view in the bottom direction of the developing apparatus shown in FIG. 4.

In order to further ensure the detecting accuracy of the developing effect, as shown in FIG. 5, three color sensing units 15 arranged at a side of the development area (area B in FIG. 5) on the substrate 12 can be utilized. Spacing between the three color sensing units 15 can be regulated, so as to adapt the production of panels of various dimensions. RGB color sensors can be used as the color sensing units 15; and the color sensors can emit trichroic light toward the substrate 12. The photoresist on the substrate 12 would be selectively transmissive or reflective to the three colors in the trichroic light. The amount of reflected light received by the color sensors will be converted to ratios among amounts of the lights having the three colors respectively, and thus it's possible to identify the color of the substrate 12 after development, and the detecting result can be converted into a digital chromatic value. One can determine whether the photoresist in the development area is subjected to a complete development after comparing this chromatic value with a preset chrominance range. As such, the accuracy of the detection is further ensured.

The embodiments of present invention also provide a method for monitoring the developer solution, which method is applicable in the developing process of the substrate to be developed in the developer solution, wherein the substrate to be developed is coated with photoresist of a first color thereon.

The method for monitoring the developer solution comprises:

S601, emitting detecting light toward a development area of the substrate to be developed within a scheduled time after the substrate to be developed is immersed into the developer solution;

S602, determining a development time interval which it takes for development to occur in the development area by means of the detecting light; and S603, determining that the developer solution is failed, if the time interval is out of a preset time range.

The method for monitoring the developer solution provided according to the embodiments of present invention is used in the developing process of the substrate to be developed immersed into the developer solution, wherein the detecting unit emits detecting light toward the development area of the substrate to be developed within the scheduled time after the substrate to be developed is immersed into the developer solution, and then the processing unit electrically coupled with the photodetection unit determines whether the developer solution is failed by determining the development time interval which it takes for development to occur in the development area by means of the detecting light and by comparing the development time interval with the preset time range. With such a method for monitoring the developer solution, by directly detecting the peeling process of the photoresist, its possible to effectively and accurately monitor the developing effect of the developer solution during the course of recycling the developer solution, thereby avoiding the wastage of the developer solution while ensuring the developing effect of the developer solution. In so doing, not only manufacturing cost for products is reduced, but also product quality is largely improved.

For example, the method for monitoring the developer solution provided according to the fourth embodiment of the present invention comprises:

S701, emitting detecting light of a second color toward the development area of the substrate to be developed within the scheduled time after the substrate to be developed is immersed into the developer solution, and receiving the detecting light of the second color;

S702, obtaining a first time point when the detecting light is emitted and a second time point when the detecting light is received, and calculating the time interval between the first time point and the second time point as the development time interval; and S703, determining that the developer solution is failed, if the development time interval is determined to be out of the preset time range.

In S701, it is to be noted that, in actual detecting process, wavelength of the detecting light can be selected according to the color of the photoresist, since the photoresist may have different colors. For example, when the photoresist is green, red light with a wavelength of 700.0 nm can be selected as the detecting light. Since green photoresist usually can only transmit green light while the red light is difficult to be transmitted, the purpose of detecting the transmitted light can be effectively achieved by taking red light as the detecting light. In a similar way, when a substrate provided with red photoresist needs to be detected, blue light with a wavelength of 435.8 nm or green light with a wavelength of 546.1 nm can be selected; and when a substrate provided with blue photoresist needs to be detected, red light or green light can be similarly selected; and when the photoresist on the black matrix needs to be detected, white light or light of other colors can be selected.

The method for monitoring the developer solution can further comprise: determining that the concentration value of the developer solution is less than the preset concentration value if the development time interval is determined to be greater than a first preset time; and determining that the concentration value of the developer solution is greater than the preset concentration value if the time interval is determined to be less than a second preset time, wherein the first preset time is greater than the second preset time.

For example, when the first preset time is 20 s, then if the detected time interval is 25 s, it's determined the developer solution has a weak developing capacity and poor developing effect. The degrading of the developing effect usually is due to the decreasing of the concentration of the developer solution, which would cause an incomplete development of the photoresist within the scheduled time. When the time interval is greater than the first preset time, the concentration of the developer solution can be increased to the preset concentration value with user's manual regulation or with auto regulation by the regulating device, or by replacing the developer solution.

As another example, when the second preset time is 10 s, then if the detected time interval is 5 s, it's determined the developing capacity of the developer solution is too strong and the developing effect is excessively powerful. Usually, excessively powerful developing effect is caused by too high concentration of the developer solution, which will cause excessive development of the photoresist within the scheduled time and thus cause peeling of photoresist in an area that is not intended to be developed. When the time interval is less than the second preset time, it's possible to decrease the concentration of the developer solution to preset concentration value with user's manual regulation or with auto regulation by the regulating device, or by replacing the developer solution.

As compared with the above steps of the method for monitoring the developer solution according to the fourth embodiment of the present invention, the method for monitoring the developer solution according to the fifth embodiment of the present invention can further comprise:

S704, emitting chrominance detecting light toward the development area of the substrate to be developed;

S705, determining a chromatic value of the development area by means of the chrominance detecting light; and S706, determining that the developer solution is failed, if the chromatic value is determined to be out of a preset chrominance range.

For example, a color sensor can be used to detect the chromatic value of the development area; the color sensor can emit trichroic light toward the substrate to be developed. The photoresist on the substrate to be developed would be selectively transmissive or reflective to the three colors in the trichroic light. The amount of reflected light received by the color sensor will be converted to ratios among amounts of the lights having the three colors respectively, and thus it's possible to identify the color of the substrate to be developed after development. The detecting result can be converted into a digital chromatic value, and one can determine whether the photoresist in the development area is subjected to a complete development by comparing this chromatic value with the preset chrominance range. As such, the accuracy of the detection is further ensured.

The method for monitoring the developer solution can further comprise:

S707, indicating the failure of the developer solution to the user.

The method for monitoring the developer solution provided according to the embodiment of present invention is used in the developing process of the substrate to be developed immersed into the developer solution, wherein the detecting unit emits detecting light toward the development area of the substrate to be developed within a scheduled time after the substrate to be developed is immersed into the developer solution, and then the processing unit electrically coupled with the photodetection unit determines whether the developer solution is failed, by determining the development time interval which it takes for development to occur in the development area by means of the detecting light, and by comparing the development time interval with the preset time range. With such a method for monitoring the developer solution, by directly detecting the peel process of the photoresist, it's possible to effectively and accurately monitor the developing effect of the developer solution during the course of recycling the developer solution, thereby avoiding the wastage of the developer solution while ensuring the developing effect of the developer solution. In so doing, not only manufacturing cost for products is reduced, but also product quality is largely improved.

Further, as shown in FIG. 8, the method for monitoring the developer solution according to the sixth embodiment of the present invention comprises:

S801, emitting chrominance detecting light toward the development area of the substrate to be developed within a scheduled time after the substrate to be developed is immersed into the developer solution;

S802, determining a chromatic value of the development area by means of the chrominance detecting light;

S803, obtaining a first time point when the detecting light is emitted and a second time point when the chromatic value of the development area varies to be within a preset chrominance range, and calculating the time interval between the first time point and the second time point as the development time interval; and S804, determining that the developer solution is failed, if the time interval is determined to be out of a preset time range.

For example, a color sensor can be used to detect the chromatic value of the development area; and the color sensor can emit a trichroic light source toward the substrate to be developed. The photoresist on the substrate to be developed is selectively transmissive or reflective to the three colors in the trichroic light. The amount of reflected light received by the color sensor will be converted to ratios among amounts of the lights having the three colors respectively, and thus it's possible to identify the color of the substrate to be developed after development. The detecting result can be converted into a digital chromatic value, and one can determine whether the photoresist in the development area is subjected to a complete development by comparing this chromatic value with the preset chrominance range. With such a method for monitoring the developer solution, by directly detecting the peel process of the photoresist, it's possible to effectively and accurately monitor the developing effect of the developer solution during the course of recycling the developer solution, thereby avoiding the wastage of the developer solution while ensuring the developing effect of the developer solution. In so doing, not only manufacturing cost for products is reduced, but also product quality is largely improved.

Furthermore, the method for monitoring the developer solution can further comprise:

S805, indicating the failure of the developer solution to the user.

The method for monitoring the developer solution provided according to the embodiment of present invention is used in the developing process of the substrate to be developed immersed into the developer solution, wherein the detecting unit emits detecting light toward the development area of the substrate to be developed within the scheduled time after the substrate to be developed is immersed into the developer solution, and then the processing unit electrically coupled with the photodetection unit determines whether the developer solution is failed by determining the development time interval which it takes for development to occur in the development area by means of the detecting light and by comparing the development time interval with the preset time range. With such a method for monitoring the developer solution, by directly detecting the peeling process of the photoresist, it's possible to effectively and accurately monitor the developing effect of the developer solution during the course of recycling the developer solution, thereby avoiding the wastage of the developer solution while ensuring the developing effect of the developer solution. In so doing, not only manufacturing cost for products is reduced, but also product quality is largely improved.

The above description is only specific embodiments of the present invention, the protective scope of the present invention is not limited thereto, and variation or alternation can be readily conceivable by the skilled in this art within the technical scope disclosed by the present invention, all of which are encompassed within the protective scope of the present invention. Hence, the protection scope of the present invention is defined by the claims as well as equivalents thereof.

What is claimed is:

1. A developing apparatus, comprising a dipper for accommodating a developer solution and a substrate supporter located in the dipper for placing a substrate to be developed thereon, the substrate supporter allowing light to pass through; wherein, the substrate to be developed is coated thereon with a photoresist of a first color; wherein the developing apparatus further comprises a photodetection unit and a processing unit electrically coupled to the photodetection unit;

wherein the photodetection unit comprises:
a light-emitting module provided at a side of the substrate supporter, the light-emitting module emitting detecting light of a second color toward a development area of the substrate to be developed within a scheduled time after the substrate to be developed is immersed into the developer solution; and
a light-receiving module provided at the other side of the substrate supporter, opposite to the light-emitting module, for receiving the detecting light from the light-emitting module; and wherein the processing unit is configured to obtain and determine a first time point when the light-emitting module emits detecting light of the second color and a second time point when the light-receiving module receives said detecting light, and to calculate a development time interval, as a difference between the first time point and the second time point, and further to determine that the developer solution has failed if the development time interval is determined to be out of a preset time range.

2. The developing apparatus according to claim 1, wherein the developing apparatus further comprises: a color sensing unit provided at a side of the substrate supporter, and the color sensing unit is configured to emit chrominance detecting light toward the development area of the substrate to be developed after the second time point and to determine a chromatic value of the development area by means of the chrominance detecting light, and wherein the processing unit is electrically coupled to the color sensing unit, and is also configured to determine that the developer solution has failed if the chromatic value is determined to be out of a preset chrominance range.

3. The developing apparatus according to claim 1, wherein the processing unit is also configured to:

determine that a concentration value of the developer solution is less than a preset concentration value if the determined development time interval is greater than a first preset time; and determine that the concentration value of the developer solution is greater than the preset concentration value if the determined development time interval is less than a second preset time; wherein the first preset time is greater than the second preset time.

4. The developing apparatus according to claim 1, wherein the developing apparatus further comprises:

an indicating unit electrically coupled to the processing unit, for indicating failure of the developer solution to a user when the developer solution is determined to have failed by the processing unit.

5. A developing apparatus, comprising a dipper for accommodating a developer solution and a substrate supporter located in the dipper for placing a substrate to be developed thereon and allowing light to pass through; wherein, a substrate to be developed is coated thereon with photoresist of a first color; wherein the developing apparatus further comprises a photodetection unit and a processing unit electrically coupled to the photodetection unit;

wherein the photodetection unit comprises:
a color sensing module provided at a side of the substrate supporter, the color sensing module emitting chrominance detecting light toward the development area of the substrate to be developed within a scheduled time after the substrate to be developed is immersed into the developer solution, receiving reflected light from the development area, and determining the chromatic value of the development area by means of the reflected light;
the processing unit is configured to obtain and determine a first time point when the color sensing module emits detecting light of the second color and a second time point, when the chromatic value of the development area has been varied to be within a preset chrominance range, and to calculate a development time interval as a difference between the first time point and the second time point; and further determine that the developer solution has failed if the development time interval is determined to be out of a preset time range.

6. The developing apparatus according to claim 5, wherein the processing unit is also configured to:
determine that a concentration value of the developer solution is less than a preset concentration value if the determined development time interval is greater than a first preset time; and
determine that the concentration value of the developer solution is greater than the preset concentration value if the determined development time interval is less than a second preset time; wherein the first preset time is greater than the second preset time.

7. The developing apparatus according to claim 5, wherein the developing apparatus further comprises:
an indicating unit electrically coupled to the processing unit, for indicating failure of the developer solution to a user when the developer solution is determined to have failed by the processing unit.

8. A method for monitoring developer solution, used in a developing process of a substrate to be developed in a developer solution, wherein the substrate to be developed is coated thereon with photoresist of a first color, wherein the method comprises:
emitting a detecting light of a second color toward a development area of the substrate to be developed within a scheduled time after the substrate to be developed is immersed into the developer solution;
receiving the detecting light of the second color; and
obtaining a first time point when the detecting light is emitted and a second time point when the detecting light is received, and calculating a development time interval as a difference between the first time point and the second time point, and determining that the developer solution has failed if the development time interval is determined to be out of a preset time range.

9. The method according to claim 8, wherein the method further comprises: emitting chrominance detecting light toward the development area of the substrate to be developed after the second time point;
determining a chromatic value of the development area by means of the chrominance detecting light; and
determining that the developer solution has failed if the chromatic value is determined to be out of a preset chrominance range.

10. The method according to claim 8 further comprising:
determining that a concentration value of the developer solution is less than a preset concentration value if the determined development time interval is greater than a first preset time; and
determine that the concentration value of the developer solution is greater than the preset concentration value if the determined development time interval is less than a second preset time; wherein the first preset time is greater than the second preset time.

11. A method for monitoring a developer solution, used in a developing process of a substrate to be developed in the developer solution, wherein the substrate to be developed is coated thereon with photoresist of a first color, wherein the method comprises:
emitting chrominance detecting light toward a development area of the substrate to be developed within a scheduled time after the substrate to be developed is immersed into the developer solution;
determining a chromatic value of the development area by means of the chrominance detecting light; and
obtaining a first time point when the detecting light is emitted and a second time point when the chromatic value of the development area varies be to within a preset chrominance range, and calculating a development time interval as a difference between the first time point and the second time point, and determining that the developer solution has failed if the development time interval is determined to be out of a preset time range.

12. The method according to claim 11, wherein determining the development time interval which it takes for development to occur in the development area by means of the detecting light and determining that the developer solution has failed if the development time interval is determined to be out of a preset time range comprises:
determining that a concentration value of the developer solution is less than a preset concentration value if the determined time interval is greater than a first preset time; and
determining that the concentration value of the developer solution is greater than the preset concentration value if the determined time interval is less than a second preset time;
wherein the first preset time is greater than the second preset time.

* * * * *